(12) United States Patent
Sun et al.

(10) Patent No.: US 9,034,716 B2
(45) Date of Patent: May 19, 2015

(54) METHOD OF MAKING A FINFET DEVICE (71) Applicant: Taiwan Semiconductor Manufacturing Company, Ltd., Hsin-Chu (TW)

(72) Inventors: Sey-Ping Sun, Hsinchu (TW); Sung-Li Wang, Zhubei (TW); Chin-Hsiang Lin, Hsinchu (TW); Neng-Kuo Chen, Sinshih Township, Tainan County (TW); Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/756,104

(22) Filed: Jan. 31, 2013

(65) Prior Publication Data
US 2014/0213048 A1 Jul. 31, 2014

(51) Int. Cl.
*H01L 21/336* (2006.01)
*H01L 29/40* (2006.01)

(52) U.S. Cl.
CPC .................................. *H01L 29/401* (2013.01)

(58) Field of Classification Search
CPC ............... H01L 21/823807; H01L 21/823821; H01L 21/823828; H01L 21/845; H01L 29/66545
See application file for complete search history.

(56) References Cited

U.S. PATENT DOCUMENTS

| | | | | |
|---|---|---|---|---|
| 5,928,816 A * | 7/1999 | Lee et al. | ............................ | 430/5 |
| 6,972,254 B1 * | 12/2005 | Lopatin et al. | ................ | 438/637 |
| 7,977,235 B2 * | 7/2011 | Ishizaka | ......................... | 438/629 |
| 8,114,746 B2 * | 2/2012 | Wei et al. | ....................... | 438/296 |
| 8,334,570 B2 * | 12/2012 | Xu et al. | ........................ | 257/347 |
| 8,368,149 B2 * | 2/2013 | Lander | ............................ | 257/369 |

OTHER PUBLICATIONS

S. M. Pandey et al., "Mechanism of Stress Memorization Technique (SMT) and Method to Maximize its Effect," IEEE Electron Device Letters, vol. 32, No. 4, Apr. 2011, pp. 467-469.

* cited by examiner

*Primary Examiner* — Zandra Smith
*Assistant Examiner* — Andre'C Stevenson
(74) *Attorney, Agent, or Firm* — Haynes and Boone, LLP (57) ABSTRACT

A FinFET device is fabricated by first receiving a FinFET precursor. The FinFET precursor includes a substrate, fins on the substrate, isolation regions on sides of the fins and dummy gate stacks on the substrate including wrapping a portion of the fin, which is referred to as a gate channel region. The dummy gate stacks is removed to form a gate trench and a gate dielectric layer is deposited in the gate trench. A metal stressor layer (MSL) is conformably deposited on the gate dielectric layer. A capping layer is deposited on the MSL. A thermal treatment is applied to the MSL to achieve a volume expansion. Then the capping layer is removed and a metal gate (MG) is formed on the MSL.

10 Claims, 8 Drawing Sheets

METHOD OF MAKING A FINFET DEVICE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-type field-effect transistor (FinFET), has been introduced to replace a planar transistor. Although existing FinFET devices and methods of fabricating FinFET devices have been generally adequate for their intended purposes, they have not been entirely satisfactory in all respects. For example, forming a three dimension strained channel raises challenges in a FinFET process development. It is desired to have improvements in this area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Examples of devices that can benefit from one or more embodiments of the present application include FinFET devices. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. The following disclosure will continue with a FinFET example to illustrate various embodiments of the present application. It is understood, however, that the application should not be limited to a particular type of device, except as specifically claimed.

Figure 1:
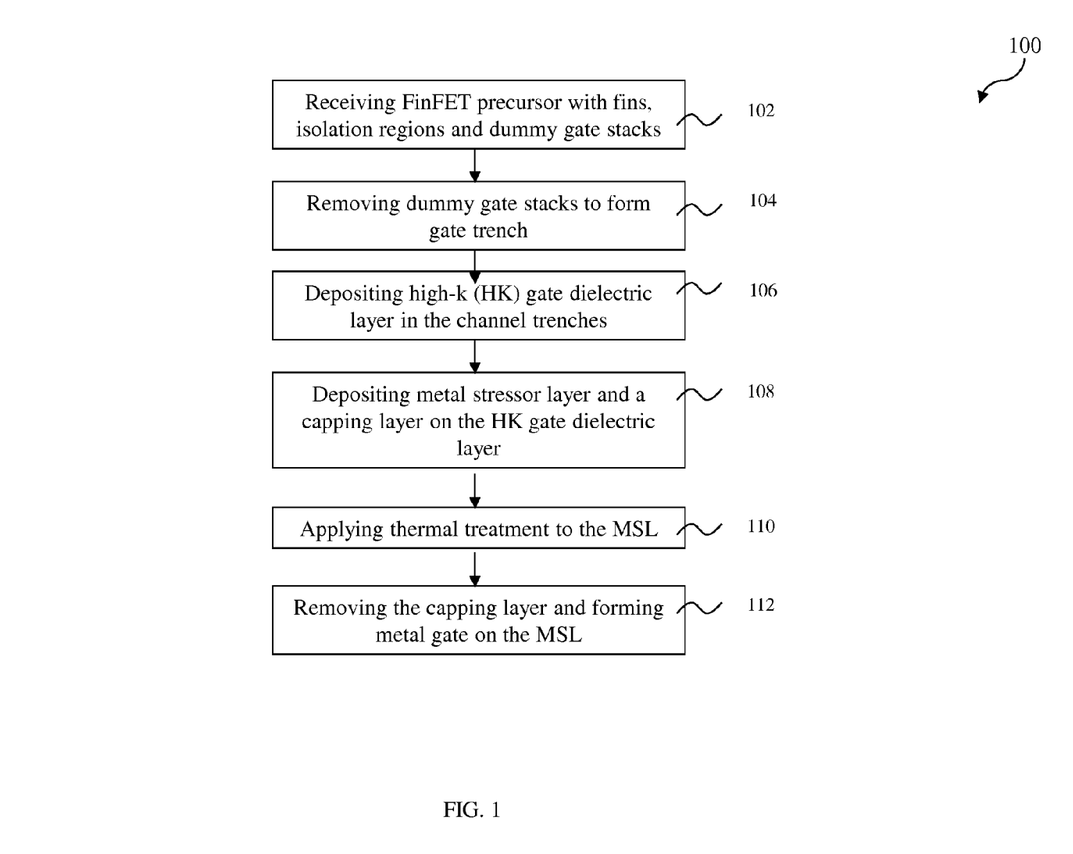
FIG. 1 is a flow chart of an example method for fabricating a FinFET device according to various aspects of the present disclosure.
Figure 2:
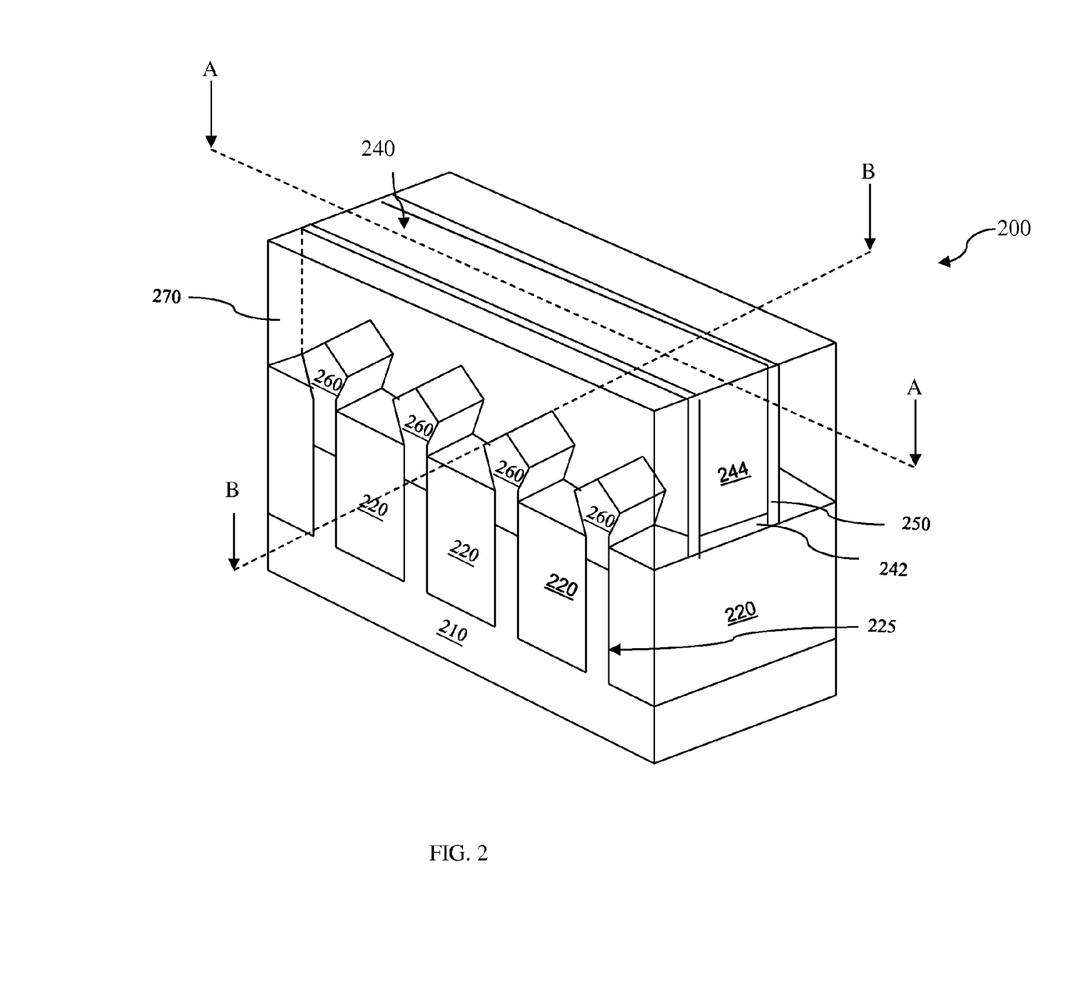
FIG. 2 is a side-perspective of a FinFET precursor according to various aspects of the present disclosure.

FIG. 1 is a flowchart of a method 100 for fabricating a FinFET device according to aspects of the present disclosure. FIG. 2 is a side-perspective view of a precursor for the FinFET, labeled with the reference numeral 200, manufactured according to the method of FIG. 1. FIGS. 3A, 4A, 5A, 6A, 7A and 8A are cross section views along the line A-A of FIG. 2. FIGS. 3B, 4B, 5B, 6B, 7B and 8B are cross section views along the line B-B of FIG. 2 and perpendicular to the direction of the line of A-A. It is understood that additional steps can be provided before, during, and after the method, and some of the steps described can be replaced or eliminated for other embodiments of the method.

Referring to FIGS. 1, 2, 3A and 3B, the method 100 begins at step 102 by receiving the FinFET precursor 200. The FinFET precursor 200 includes a substrate 210. The substrate 210 may be a bulk silicon substrate. Alternatively, the substrate 210 may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 210 also include a silicon-on-insulator (SOI) substrate. SOI substrates are fabricated using separation by implantation of oxygen (SIMOX), wafer bonding, and/or other suitable methods.

Figure 3A:
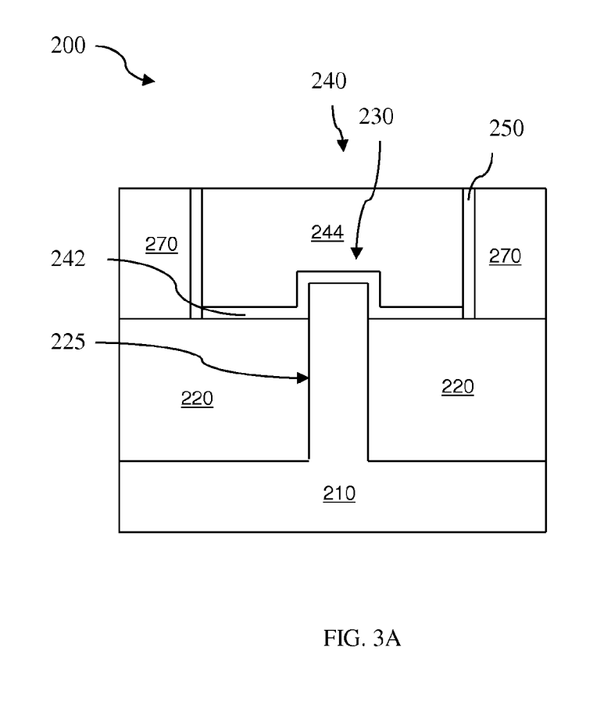
FIG. 3A illustrates a cross sectional view of a FinFET precursor along line A-A in FIG. 2.
Figure 3B:
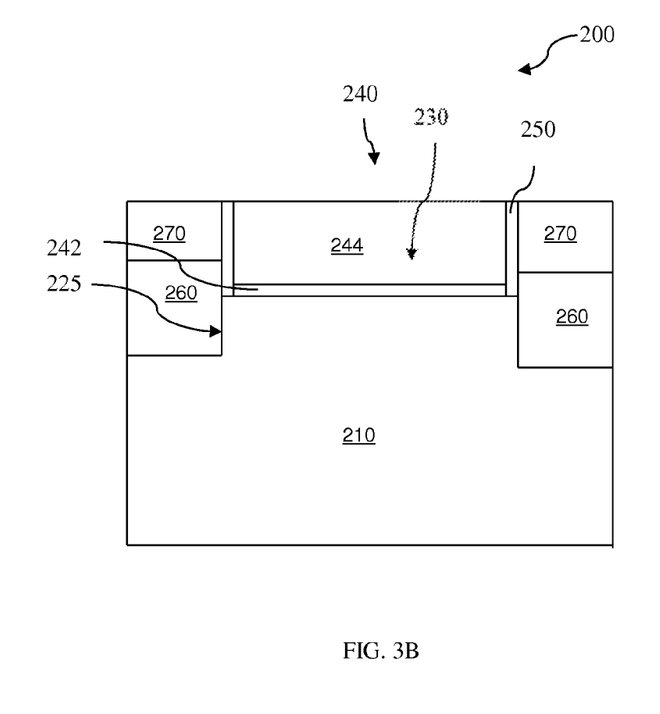
FIG. 3B illustrates cross sectional view of a FinFET precursor along line B-B in FIG. 2.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary FinFET precursors 200, the insulator layer is a component (e.g., layer) of a silicon-on-insulator substrate.

The FinFET precursor 200 may also include various doped regions on the substrate 210. The doped regions may be doped with p-type dopants, such as boron or BF2; n-type dopants, such as phosphorus or arsenic; or combinations thereof. The doped regions may be formed directly on the substrate 210, in a P-well structure, in an N-well structure, in a dual-well structure, or using a raised structure. The substrate 210 may further include various active regions, such as regions configured for an N-type metal-oxide-semiconductor transistor device and regions configured for a P-type metal-oxide-semiconductor transistor device.

The FinFET precursor 200 may also include isolation regions 220 formed on the substrate 210 to isolate active regions of the substrate 210. The isolation region 220 may be formed using traditional isolation technology, such as shallow trench isolation (STI), to define and electrically isolate the various regions. The isolation region 220 comprises silicon oxide, silicon nitride, silicon oxynitride, an air gap, other suitable materials, or combinations thereof. The isolation region 220 is formed by any suitable process. As one example, the formation of an STI includes a photolithography process, an etch process to etch a trench in the substrate 210 (for example, by using a dry etching and/or wet etching), and a deposition to fill in the trench (for example, by using a chemical vapor deposition process) with one or more dielectric materials. In some examples, the filled trench may have a multi-layer structure such as a thermal oxide liner layer filled with silicon nitride or silicon oxide. In the present embodiment, where the substrate 210 remaining between trenches forms fins 225 and the fins 225 are separated by the isolation regions 220.

The FinFET precursor 200 may also include one or more dummy gate stacks 240 formed over the substrate 210, including over a portion of the fins 225, where it is referred to as a gate channel region 230. The dummy gate stacks 240 are to be replaced later by a high-k (HK) and metal gate (MG) after high thermal temperature processes are performed, such as thermal processes during sources/drains formation. The dummy gate stack 240 may include the dielectric layer 242, the polysilicon layer 244. The dummy gate stack 240 is formed by any suitable process or processes. For example, the gate stack 240 can be formed by a procedure including deposition, photolithography patterning, and etching processes. The deposition processes include chemical vapor deposition (CVD), physical vapor deposition (PVD), atomic layer deposition (ALD), other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. The etching processes include dry etching, wet etching, and/or other etching methods (e.g., reactive ion etching). The dielectric layer 242 includes silicon oxide, silicon nitride, or any other suitable materials.

The FinFET precursor 200 may also include sidewall spacers 250 formed along the dummy gate stacks 240. The sidewall spacers 250 may include a dielectric material such as silicon oxide, silicon nitride, silicon carbide, silicon oxynitride, or combinations thereof. Typical formation methods for the sidewall spacers 250 include depositing a dielectric material over the gate stack and then anisotropically etching back the dielectric material. The etching back process may include a multiple-step etching to gain etch selectivity, flexibility and desired overetch control.

The FinFET precursor 200 may also include source/drain features 260 formed on the substrate 210. The source/drain features 260 may be formed by recessing a portion of the fin 225 beside the gate channel region 230 to form source/drain recessing trenches and epitaxially growing a semiconductor material layer on the recessed fin 225 in the sources/drains recessing trenches. The semiconductor material layer includes element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP). The epitaxial processes include CVD deposition techniques (e.g., vapor-phase epitaxy (VPE) and/or ultra-high vacuum CVD (UHV-CVD)), molecular beam epitaxy, and/or other suitable processes. The source/drain features 260 may be formed by one or more epitaxy or epitaxial (epi) processes. The source/drain features 260 may be in-situ doped during the epi process. For example, the epitaxially grown SiGe source/drain features 260 may be doped with boron; and the epitaxially grown Si epi source/drain features 260 may be doped with carbon to form Si:C source/drain features, phosphorous to form Si:P source/drain features, or both carbon and phosphorous to form SiCP source/drain features. In one embodiment, the source/drain features 260 are not in-situ doped, an implantation process (i.e., a junction implant process) is performed to dope the source/drain features 260. One or more annealing processes may be performed to activate source/drain epitaxial feature. The annealing processes comprise rapid thermal annealing (RTA) and/or laser annealing processes.

The FinFET precursor 200 may also an interlayer dielectric (ILD) layer 270 formed on the substrate 210 including between the dummy gate stacks 240. The ILD layer 270 includes silicon oxide, oxynitride or other suitable materials. The ILD layer 270 includes a single layer or multiple layers. The ILD layer 270 is formed by a suitable technique, such as CVD, ALD and spin-on (SOG). A chemical mechanical polishing (CMP) process may be performed to remove excessive ILD layer 270 and planarize the top surface of the ILD layer 270 with the top surface of the dummy gate stacks 240.

Figure 4A:
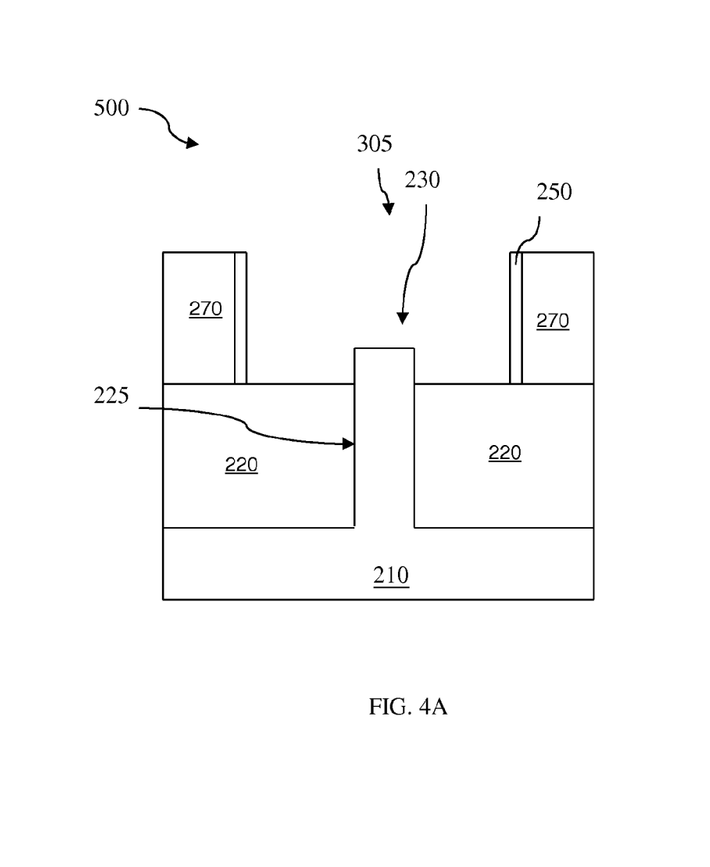
FIGS. 4A, 5A, 6A, 7A and 8A illustrate cross sectional views of a FinFET device along line A-A in FIG. 2.
Figure 4B:
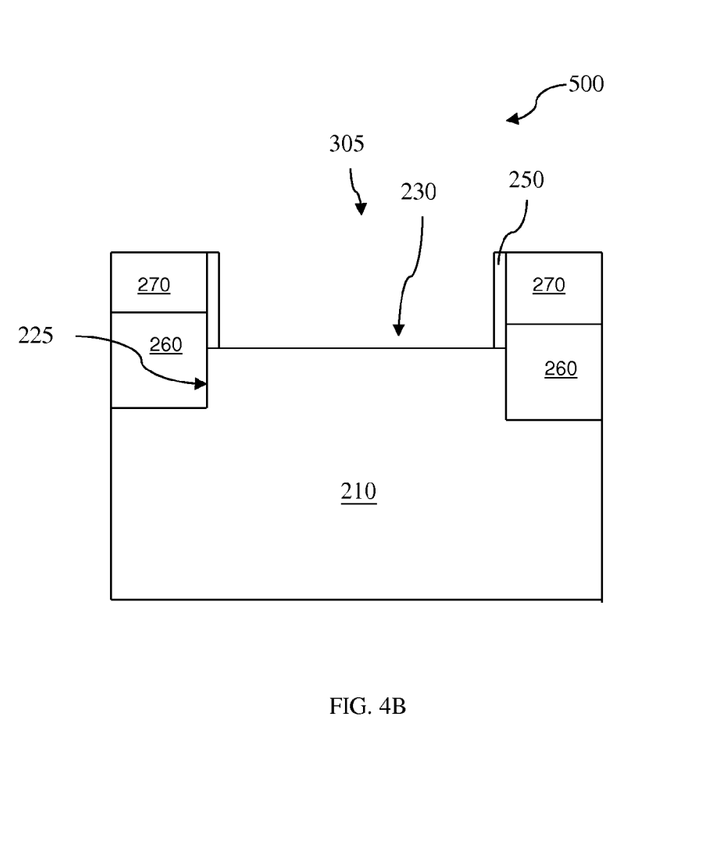
FIGS. 4B, 5B, 6B, 7B and 8B illustrate cross sectional views of a FinFET device along line B-B in FIG. 2.

Referring to FIGS. 1 and 4A-4B, once the FinFET precursor 200 is received, the method 100 proceeds to step 104 by removing the dummy gate stacks 240 to expose the gate channel region 230 of the fins 255 to form a gate trench 305 on the FinFET device 500. The dummy gate stacks 240 may be removed by lithography pattern and etch processes. Alternatively, the dummy gate stacks 240 may be removed by a selective wet etch or a selective dry etch.

Figure 5A:
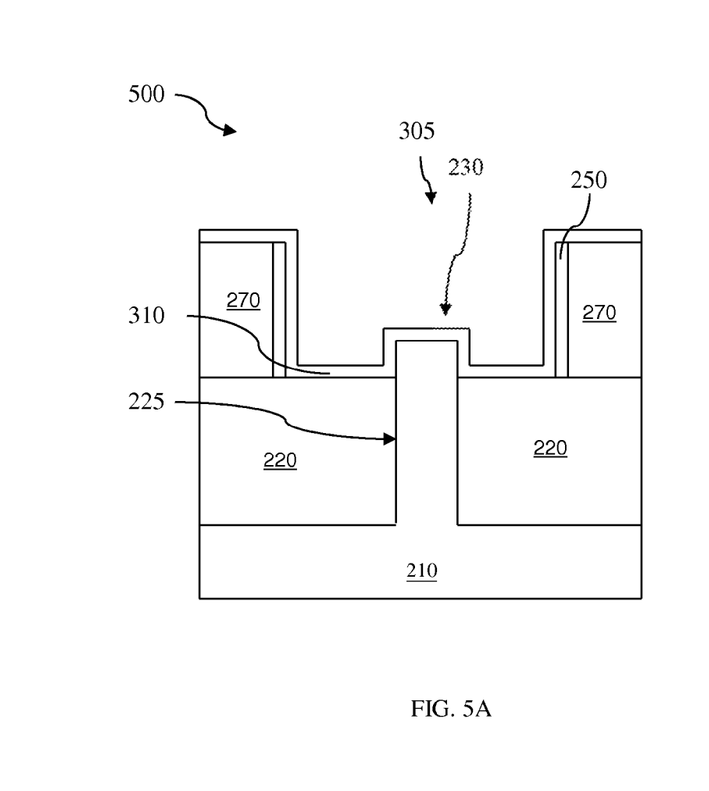
Figure 5B:
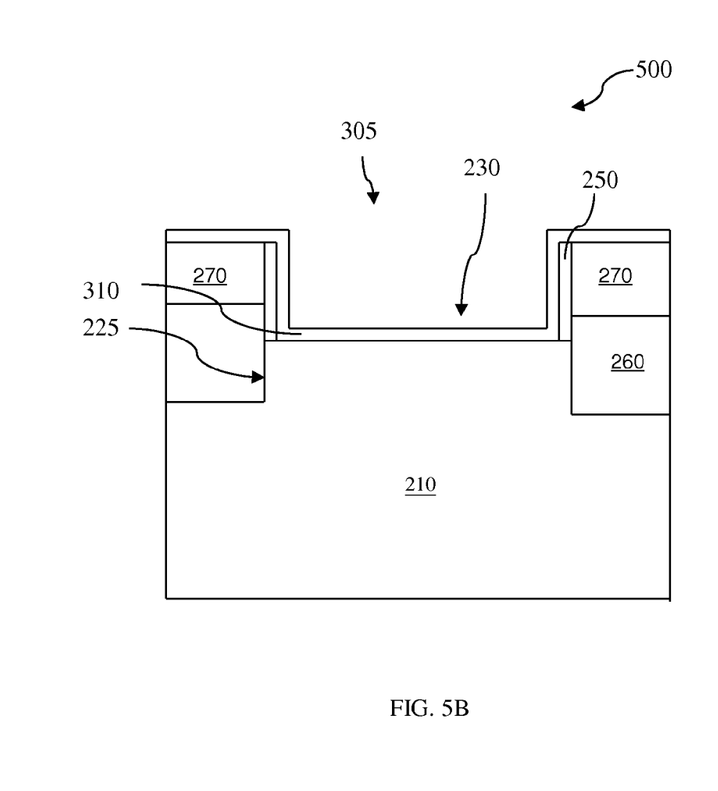

Referring to FIGS. 1 and 5A-5B, the method 100 proceeds to step 106 by depositing a gate dielectric layer 310 over the channel region 230 on the substrate 210. The gate dielectric layer 310 may include an interfacial layer (IL) deposited by any appropriate method, such as atomic layer deposition (ALD), chemical vapor deposition CVD and ozone oxidation. The IL includes oxide, HfSiO and oxynitride. The gate dielectric layer 310 may also include a high-k (HK) dielectric layer deposited on the IL by suitable techniques, such as ALD, CVD, metalorganic CVD (MOCVD), physical vapor deposition (PVD), thermal oxidation, combinations thereof, or other suitable techniques. The HK dielectric layer may include LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfSiO, (Ba,Sr)TiO3 (BST), Al2O3, Si3N4, oxynitrides (SiON), or other suitable materials.

Figure 6A:
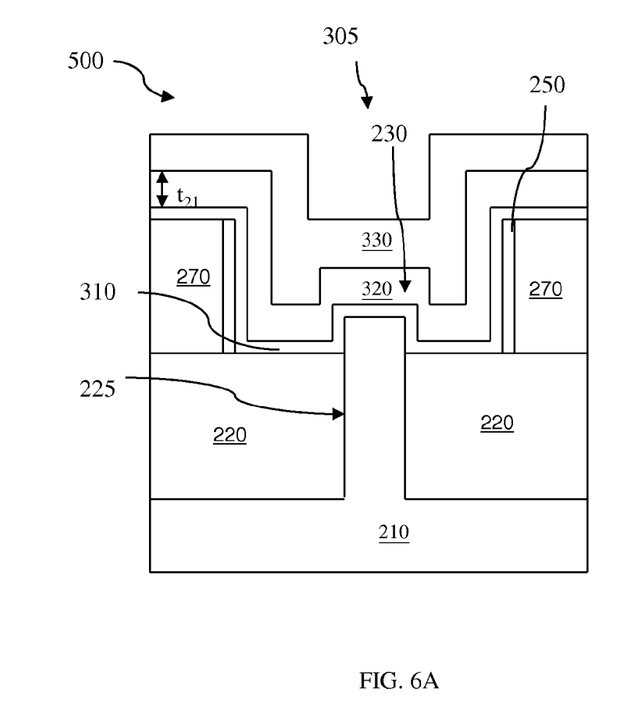
Figure 6B:
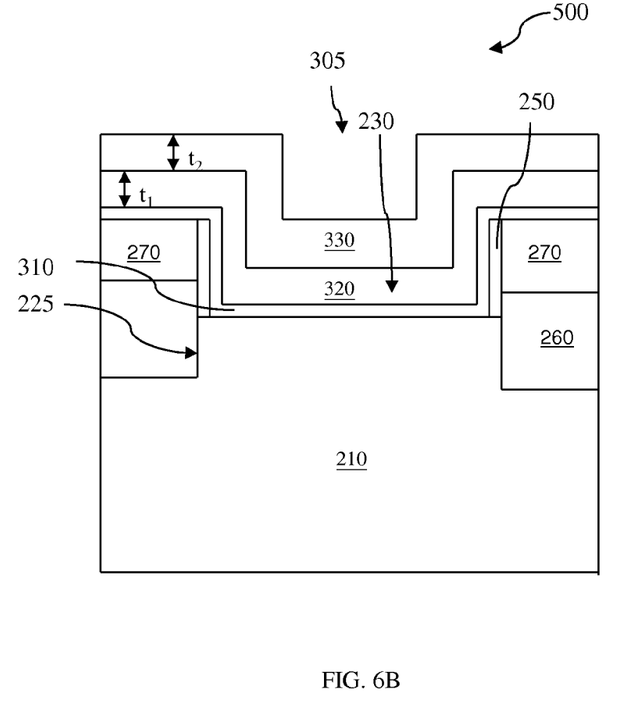

Referring to FIGS. 1 and 6A-6B, the method 100 proceeds to step 108 by depositing a metal stressor layer (MSL) 320 and a capping layer 330 on gate dielectric layer 310 on the gate channel region 230 in the gate trench 305. The MSL 320 may include Ti, Ag, Al, TiAlN, TaC, TaCN, TaSiN, Mn, Zr, TiN, TaN, Ru, Mo, Al, WN, Cu, W, Co, Ni, TiC, TiAlC, TaAlC, or any suitable materials. The MSL 320 is substantially conformal deposited on the gate dielectric layer 310 with a first thickness $t_1$. The MSL 320 may be deposited by PVD, ALD, CVD, or the combination of them. The capping layer 330 may include silicon nitride (SiN), silicon carbide (SiC), silicon oxynitride (SiON), silicon carbon-nitride (SiCN), or other suitable materials. The capping layer 330 may be deposited by low pressure CVD (LPCVD), plasma enhanced CVD (PECVD), atomic layer deposition CVD (ALDCVD), or other suitable processes. The capping layer 330 has a second thickness $t_2$.

In the present embodiment, the MSL 320 is formed with a crystalline structure such that it will undergo a volume expansion in a subsequent thermal treatment, which will be described in details later. At the same time, the capping layer 330 is formed such that it will undergo a substantially smaller volume expansion than the one of the MSL 320 in the subsequent thermal treatment. In one embodiment, an amorphous-tungsten (α-W) MSL 320 is deposited substantially conformal on the gate dielectric layer 310 on the gate channel region 230 by CVD and SiN capping layer is deposited on the α-W MSL 320. In another embodiment, a poly-crystalline W layer is deposited conformally on the gate dielectric layer 310 first and then an implantation process, such as inert gases comprising argon implant or helium implant, is applied to the poly-crystalline W layer to convert it to the α-W MSL 320. Afterwards, a SiN capping layer 330 is deposited on the α-W MSL 320.

Figure 7A:
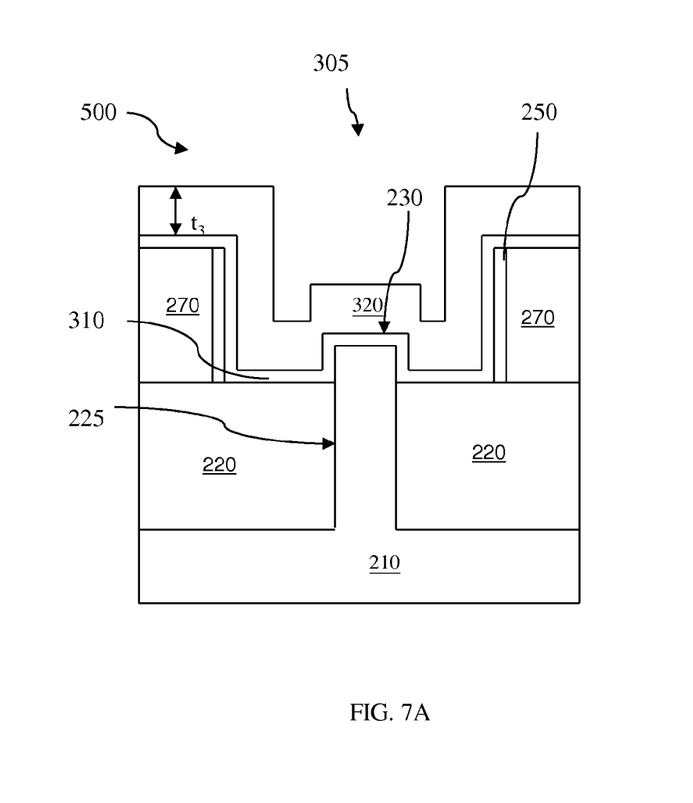
Figure 7B:
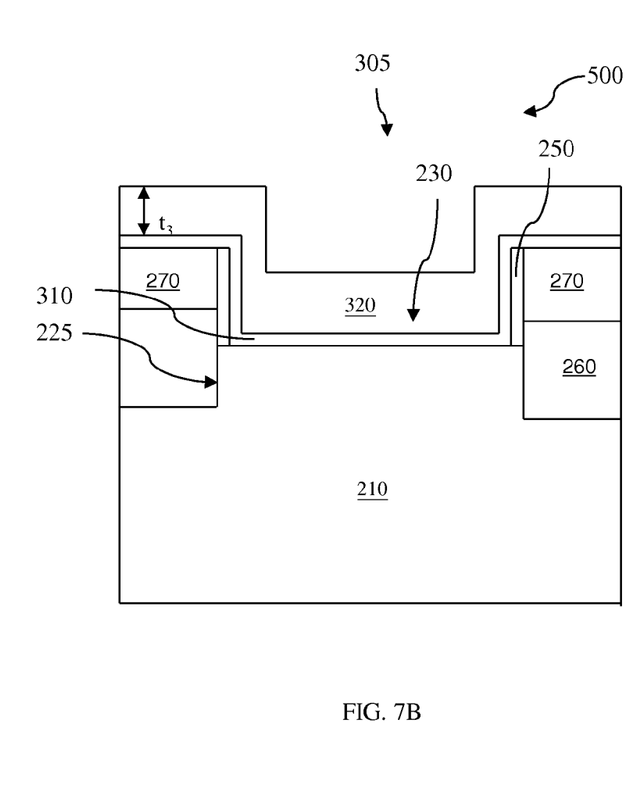

Referring to FIGS. 1 and 7A-7B, the method 100 proceeds to step 110 by performing a thermal treatment to re-crystallize the MSL 320 of the FinFET device 500. During the thermal treatment, the MSL 320 obtains volume expansion under the capping layer 330, which induces an effective strain toward the underneath gate channel region 230. In the present embodiment, a temperature of the thermal treatment is higher than a temperature of formation of the MSL layer 320. The thickness of the MSL 320 increases from $t_1$ to $t_3$. The thermal treatment may comprise a rapid thermal anneal (RTA), a laser anneal, a furnace anneal, and/or a flash lamp anneal. After the thermal treatment, the capping layer 330 is removed from the gate channel region 230. The removal process may include a wet etching or a dry etching process. As an example, a SiN capping layer 330 is removed by an etching process involving phosphoric acid. As another example, the SiN capping layer 330 is etched away by a hydrofluoric acid (HF) or buffered HF.

Figure 8A:
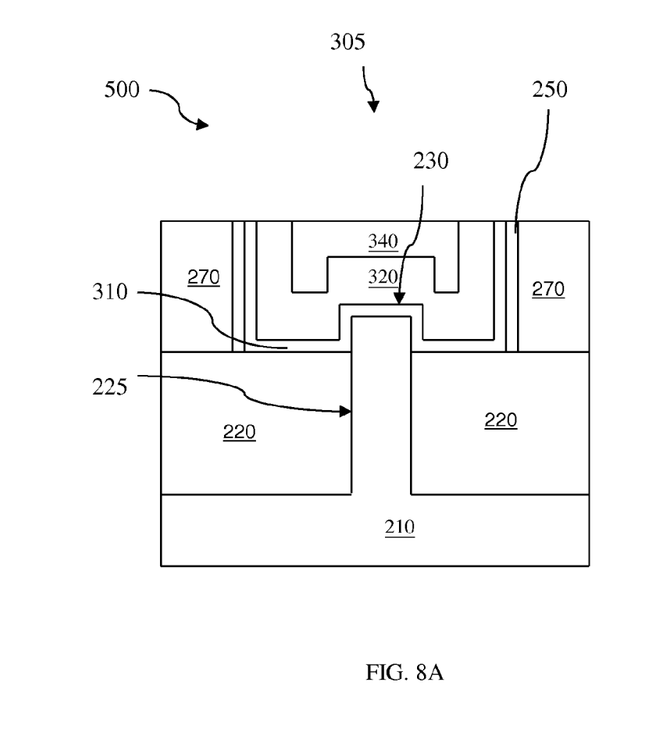
Figure 8B:
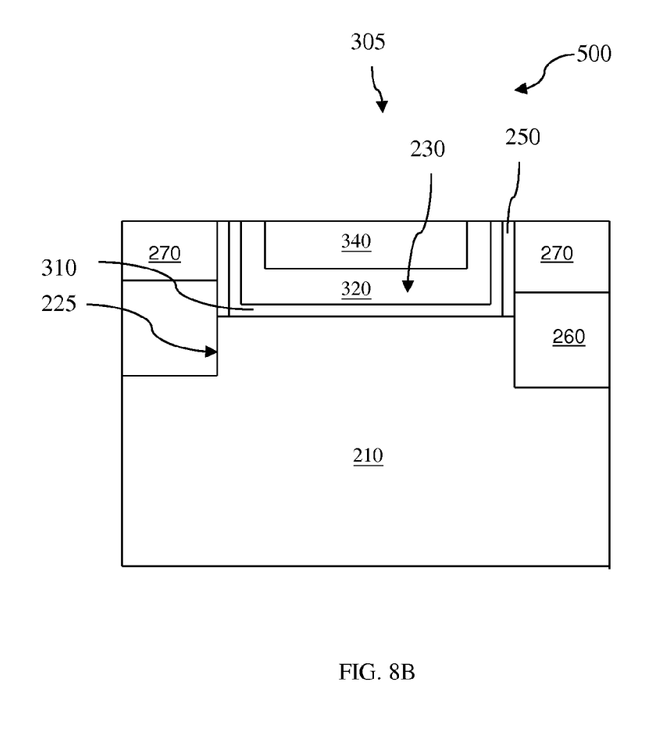

Referring to FIGS. 1 and 8A-8B, the method 100 proceeds to step 112 by removing the capping layer 330 and forming a metal gate (MG) 340 on the MSL 320. The capping layer 330 is removed by dry etching, wet etching, and/or other etching methods. The MG 340 may include a single layer or multi layers. The MG 340 may include Ti, Ag, Al, TiAlN, TaC, TaCN, TaSiN, Mn, Zr, TiN, TaN, Ru, Mo, Al, WN, Cu, W, Co, Ni, TiC, TiAlC, TaAlC, or any suitable materials. The MG 340 may be formed by ALD, PVD, CVD, or other suitable process. As an example, the MG 340 includes poly-crystalline W deposited on the re-crystallized W MSL 320.

A CMP may be performed to remove excessive MG 340, the SML 320 and dielectric layer 310. The CMP provides a substantially planar top surface for the MG 340 and the ILD layer 270.

Additional steps can be provided before, during, and after the method 100, and some of the steps described can be replaced, eliminated, or moved around for additional embodiments of the method 100.

The FinFET device 500 may include additional features, which may be formed by subsequent processing. For example, various contacts/vias/lines and multilayer interconnect features (e.g., metal layers and interlayer dielectrics) may be formed over the substrate, configured to connect the various features or structures of the devices 500. For example, a multilayer interconnection includes vertical interconnects, such as conventional vias or contacts, and horizontal interconnects, such as metal lines. The various interconnection features may implement various conductive materials including copper, tungsten, and/or silicide.

Based on the above, the present disclosure offers methods for fabricating a FinFET device. The method employs a MSL formation and a thermal treatment to the metal MSL to obtain a volume expansion of the MSL. The method demonstrates to achieve a three dimension gate channel strain to increase carrier mobility and enhance device performance.

The present disclosure provides many different embodiments of fabricating a FinFET device that provide one or more improvements over existing approaches. In one embodiment, a method for fabricating a FinFET device includes receiving a FinFET precursor. The FinFET precursor includes a substrate, fins on the substrate, isolation regions on sides of the fins and dummy gate stacks on the substrate including wrapping a portion of the fin, which is referred to as a gate channel region. The method also includes removing the dummy gate stacks to form a gate trench, depositing a gate dielectric layer in the gate channel region in the gate trench, forming a conformable metal stressor layer (MSL) on the gate dielectric layer on the gate channel region, depositing a capping layer on the MSL, performing a thermal treatment to the MSL to achieve a volume expansion, removing the capping layer after the thermal treatment and forming metal gate (MG) on the MSL on the gate channel region.

In another embodiment, a method for fabricating a FinFET device includes receiving a FinFET precursor. The FinFET precursor includes a substrate, fins on the substrate, isolation regions on sides of the fins and dummy gate stacks on the substrate including wrapping a portion of the fin, which is referred to as a gate channel region. The method also includes removing the dummy gate stack to expose the gate channel region, depositing a high-k (HK) gate dielectric layer in the gate channel region, depositing a conformable metal stressor layer (MSL) on the HK gate dielectric layer. The MSL is selected to obtain a first volume expansion in a subsequent thermal treatment. The method also includes depositing a capping layer having on the MSL. The capping layer is selected to obtain a second volume expansion in the subsequent thermal treatment, such that the second volume expansion is substantial smaller than the first volume expansion. The method also includes performing the thermal treatment to the MSL to achieve the first volume expansion. A temperature of the thermal treatment is substantial higher than a temperature of MSL deposition. The method also includes removing the capping layer after the thermal treatment and forming metal gate (MG) on the MSL.

In yet another embodiment, a method for fabricating a FinFET device includes receiving a FinFET precursor. The FinFET precursor includes a substrate, fins on the substrate, isolation regions on sides of the fins and dummy gate stacks on the substrate including wrapping a portion of the fin, which is referred to as a gate channel region. The method also includes removing the dummy gate stack to expose the gate channel region, depositing a high-k (HK) gate dielectric layer on the gate channel region, depositing an amorphous-tungsten (α-W) metal stressor layer (MSL) on the HK gate dielectric layer, depositing a silicon nitride (SiN) capping layer on the α-W MSL; performing a thermal treatment to the α-W MSL to convert it to a poly-crystalline W to achieve a substantial volume expansion, removing the SiN capping layer after the thermal treatment and forming metal gate (MG) on the poly-crystalline W MSL.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a fin-type field-effect transistor (FinFET) device, the method comprising:

receiving a FinFET precursor, the FinFET precursor including:
   a substrate;
   fins on the substrate;
   isolation regions on sides of the fins; and
   dummy gate stacks on the substrate including a portion wrapping the fin;
removing the dummy gate stacks to form a gate trench;
depositing a gate dielectric layer in the gate channel region in the gate trench;
forming a metal stressor layer (MSL) on the gate dielectric layer, wherein the MSL is selected to have substantial larger volume expansion during the thermal treatment, wherein the MSL includes amorphous-tungsten ($\alpha$-W), wherein the $\alpha$-W is formed by:
   substantial conformably depositing a poly-crystalline W layer is on the gate dielectric layer; and
   then applying an implantation process to the poly-crystalline W layer to convert it to the $\alpha$-W;
depositing a capping layer on the MSL;
performing a thermal treatment to the MSL;
removing the capping layer after the thermal treatment; and
forming a metal gate (MG) on the MSL.

2. The method of claim 1, wherein the $\alpha$-W MSL is formed by atomic layer deposition (ALD).

3. The method of claim 1, wherein a temperature of the thermal treatment is substantial higher than a temperature of the deposition process of the MSL.

4. The method of claim 1, wherein the capping layer is selected to have a substantial smaller volume expansion than the volume expansion of the MSL during the thermal treatment.

5. The method of claim 4, wherein the capping layer includes silicon nitride.

6. The method of claim 1, wherein the capping layer includes silicon nitride.

7. The method of claim 1, wherein a thickness of the capping layer is selected to meet a predetermined magnitude of induced strain of the gate channel.

8. The method of claim 1, wherein a thickness of the MSL is selected to cooperate with a thickness of the capping layer to meet a predetermined magnitude of an induced strain of the gate channel.

9. The method of claim 1, wherein after removing the capping layer, the MSL remains on the top of gate dielectric layer.

10. The method of claim 1, wherein the MG includes poly-crystalline W layer deposited on the MSL after receiving the thermal treatment.

* * * * *